United States Patent
Miura

(10) Patent No.: US 7,613,036 B2
(45) Date of Patent: Nov. 3, 2009

(54) MEMORY ELEMENT UTILIZING MAGNETIZATION SWITCHING CAUSED BY SPIN ACCUMULATION AND SPIN RAM DEVICE USING THE MEMORY ELEMENT

(75) Inventor: Katsuya Miura, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/149,827

(22) Filed: May 8, 2008

(65) Prior Publication Data

US 2008/0310216 A1  Dec. 18, 2008

(30) Foreign Application Priority Data

Jun. 13, 2007  (JP)  ............................. 2007-155854

(51) Int. Cl.
*G11C 11/00*  (2006.01)
(52) U.S. Cl. ........................ 365/158; 365/171; 365/173
(58) Field of Classification Search ................. 365/158, 365/171, 173
See application file for complete search history.

(56) References Cited

U.S. PATENT DOCUMENTS 6,879,512 B2 *  4/2005  Luo ........................... 365/158
7,245,524 B2 *  7/2007  Yoda et al. ................. 365/158
7,286,395 B2 * 10/2007  Chen et al. .................. 365/158
7,471,550 B2 * 12/2008  Koga .......................... 365/158

OTHER PUBLICATIONS

Jun Hayakawa et al.; "Current-Driven Magnetization Switching in CoFeB/MgO/CoFeB Magnetic Tunnel Junctions"; 2005; Japanese Journal of Applied Physics, vol. 44, No. 41, pp. L1267-L1270.
F.J. Jedema et al.; Electrical Detection of Spin Precession in a Metallic Mesoscopic Spin Valve; Apr. 18, 2002; Letters to Nature, vol. 416, pp. 713-716.
T. Kimura et al.; "Switching Magnetization of a Nanoscale Ferromagnetic Particle Using Nonlocal Spin Injection"; Jan. 27, 2006; Physical Review Letters, PRL 96, pp. 037201-1 to 037201-4.

* cited by examiner

*Primary Examiner*—Anh Phung
(74) *Attorney, Agent, or Firm*—Stites & Harbison PLLC; Juan Carlos A. Marquez, Esq.

(57) ABSTRACT

Provided is a spin memory that has excellent durability. The spin memory includes a ferromagnetic word line, a nonmagnetic bit line that crosses the ferromagnetic word line, a wiring disposed so as to be opposed to the ferromagnetic word line, and a magnetoresistive element formed between the wiring and the portion where the ferromagnetic word line and the nonmagnetic bit line cross each other. At the time of writing, current is made to flow between the ferromagnetic word line and the nonmagnetic bit line. The direction of magnetization for a free layer of the magnetoresistive element is switched by accumulating spins in the nonmagnetic bit line while the spins are injected from the ferromagnetic word line. At the time of reading, current is made to flow between the nonmagnetic bit line and the wiring, and to flow in the film-thickness direction of the magnetoresistive element.

12 Claims, 7 Drawing Sheets

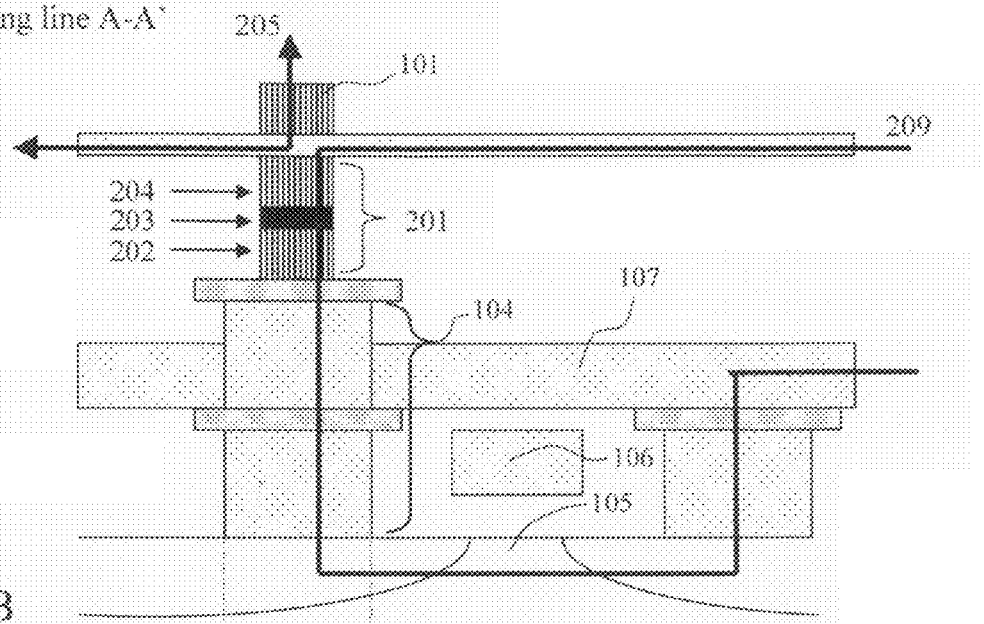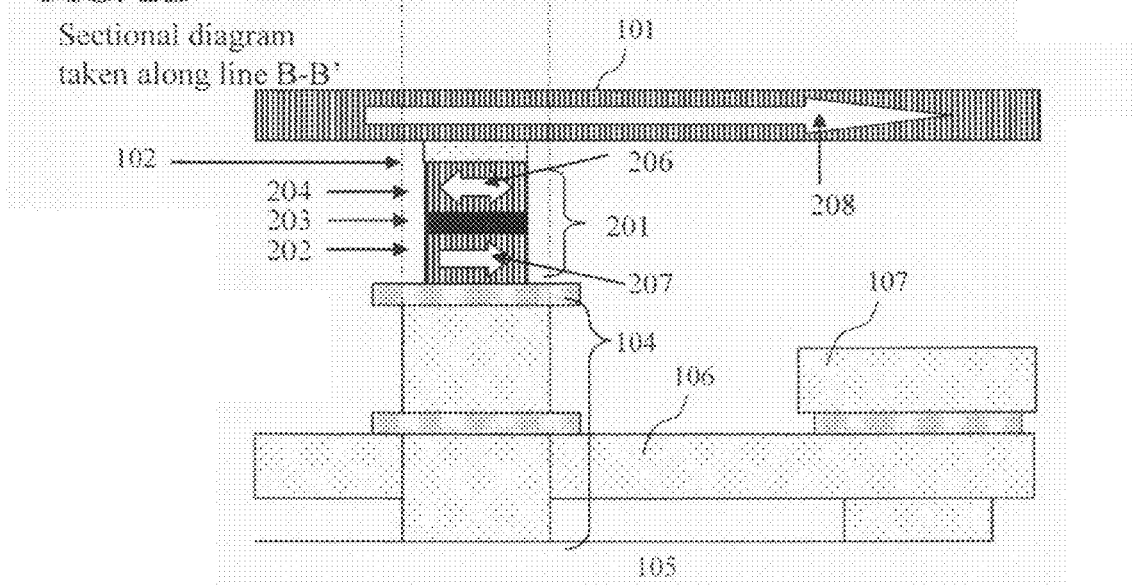

Sectional diagram taken along line B-B'

Sectional diagram taken along line B-B'

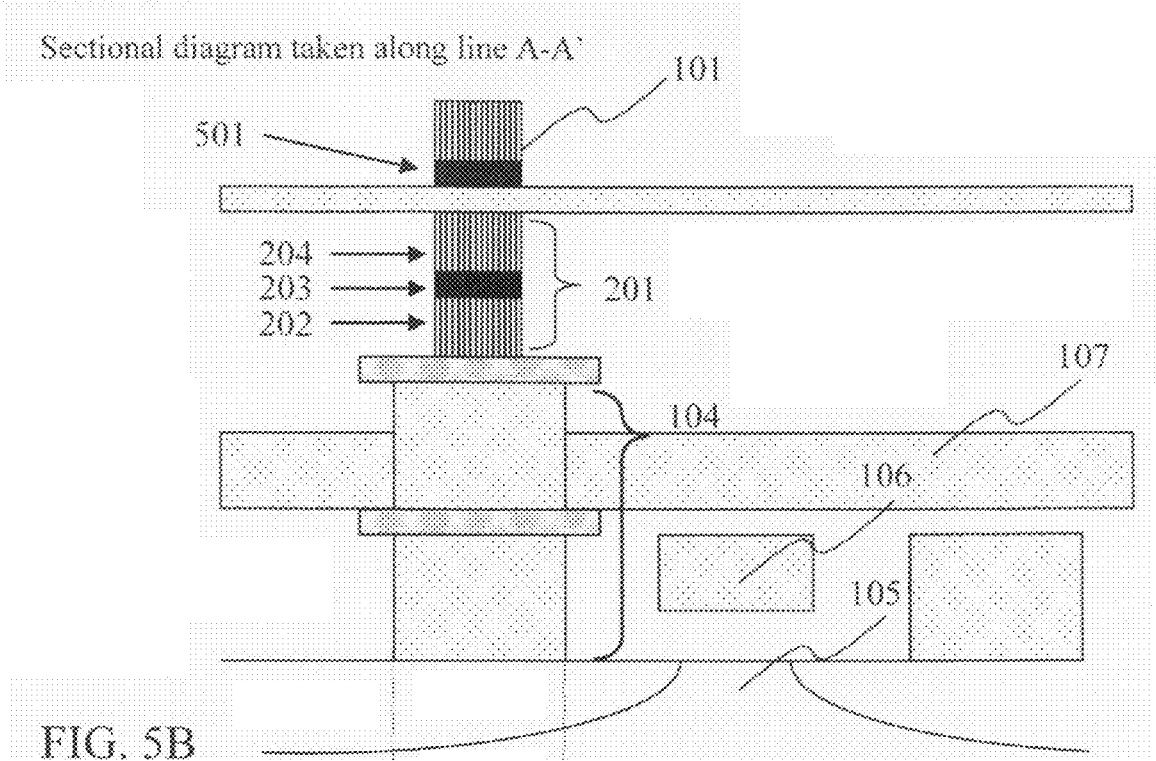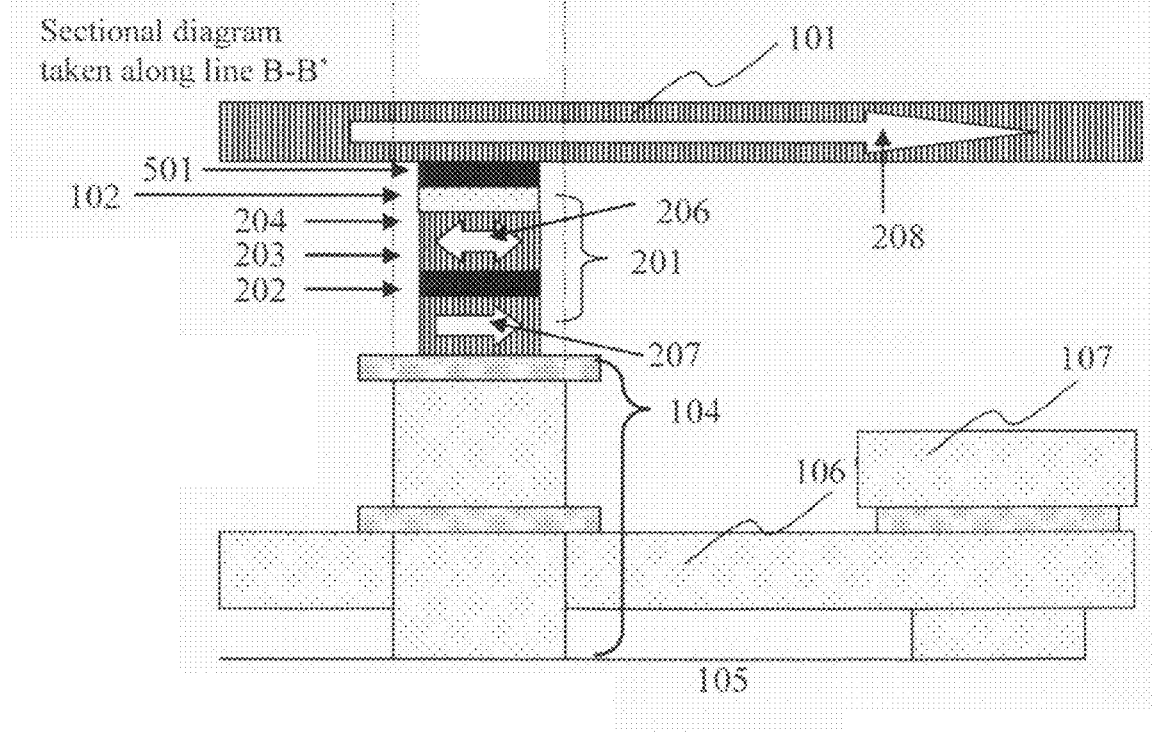

Sectional diagram taken along line A-A'

Sectional diagram taken along line B-B'

MEMORY ELEMENT UTILIZING MAGNETIZATION SWITCHING CAUSED BY SPIN ACCUMULATION AND SPIN RAM DEVICE USING THE MEMORY ELEMENT

CLAIM OF PRIORITY

The present application claims priority from Japanese application JP 2007-155854 filed on Jun. 13, 2007, the content of which is hereby incorporated by reference into this application

BACKGROUND OF THE INVENTION

1. Field of the Invention

The present invention relates to a magnetic memory for reading and writing which utilizes a spin accumulation technique and which includes a magnetoresistive element.

2. Description of the Related Art

In the field of memories represented by dynamic random access memories (DRAMs), research and development of new-type memories are now progressing all over the world. The type of memories has to satisfy the following three conditions: high speed, high integration, and low energy consumption. One of the memories that is likely very successful is a magnetic random access memory (MRAM) that satisfies these conditions and has also nonvolatility.

The MRAM has a structure in which tunnel magnetoresistive (TMR) elements are arranged in an array. The TMR element has a basic structure in which two ferromagnetic layers sandwich an insulator used as a tunnel barrier. The TMR effect is a phenomenon in which the resistance of the TMR element changes to a great degree between a case where two ferromagnetic materials have parallel directions of their magnetizations and a case where two ferromagnetic materials have anti-parallel directions of their magnetizations. The research conducted in 1990s was concentrated on TMR elements with the insulator of aluminum oxide, but in recent years, more attention has been paid to the use of magnesium oxide for the insulator. There is a report that some of the TMR elements with the insulator of magnesium oxide have accomplished an effect of higher than 300%. For more information, see, for example, Jun Hayakawa, Shoji Ikeda, Young Min Lee, Ryutaro Sasaki, Toshiyasu Meguto, Fumihiro Matsukura, Hiromasa Takahashi and Hideo Ohno, "Current-Driven Magnetization Switching in CoFeB/MgO/CoFeB Magnetic Tunnel Junctions", Jpn. J. Appl. Phys. 44, L1267 (2005).

SUMMARY OF THE INVENTION

The reading for the MRAM using the TMR effect is conducted by use of the difference between the resistance at the time when two ferromagnetic materials with the insulator located in between have magnetizations arranged in parallel to each other and the resistance at the time when the two ferromagnetic materials have magnetizations arranged in anti-parallel with each other.

The writing for the MRAM using the TMR effect is conducted by the following way. Firstly, the two ferromagnetic materials are made to have different coercivities from each other. Then, the magnetization of one of the two ferromagnetic materials is switched by means of an external magnetic field. As the external magnetic field, a synthetic magnetic field formed by the current that flows through the bit line and the current that flows through the additional write word line is generally used.

Here, the ferromagnetic layer in which the magnetization switching occurs is defined as a free layer while the ferromagnetic layer in which no magnetization switching occurs is defined as a pinned layer. The writing method by use of the external magnetic field, however, has the following problems. When smaller tunnel magnetoresistive elements (TMR elements) are used to achieve higher integration, the coercivity of the free layer increases, and the switching of magnetization of free layer by means of the external magnetic field becomes difficult.

In addition, when finer wiring through which the current flows is used to apply magnetic field, the current density becomes high and breaking occurs in the wiring. Moreover, when the current flows through the wiring, the magnetic field also affects the TMR element near the wiring. Consequently, a problem of disturbance occurs. The writing targeted for a particular TMR element accompanies the unintended writing for the TMR elements that are not the target for the writing.

A technique using spin-transfer torque, which is called a spin-transfer-torque magnetization reversal technique, has been paid more attention to address the above-mentioned problems. The technique, however, has its own drawbacks. For example, in the technique, the read-current and the write-current share a common current path. So, when there is not sufficiently large difference between the magnitude of the read-current and the write-current, the erroneous writing may possibly occur with the read-current.

In addition, the technique has other drawbacks. A larger current density that is required at the time of the writing is more likely to cause the dielectric breakdown of the TMR element. Furthermore, the need for the larger current requires a transistor to support such a large current.

To address the above-mentioned problems, a spin-accumulation magnetization-switching memory element and a magnetic random access memory according to the present invention includes a ferromagnetic word line, a nonmagnetic bit line that crosses the ferromagnetic word line, a wiring disposed so as to be opposed to the ferromagnetic word line, a magnetoresistive element formed between the wiring and the portion where the ferromagnetic word line and the nonmagnetic bit line cross each other. In addition, the magnetoresistive element includes a first ferromagnetic layer formed on the wiring side, a second ferromagnetic layer formed on the ferromagnetic-word-line side, and a nonmagnetic layer formed between the first ferromagnetic layer and the second ferromagnetic layer.

At the time of writing, current is made to flow between the ferromagnetic word line and the nonmagnetic bit line. The direction of magnetization for the second ferromagnetic layer is switched by accumulating spins of electrons in the nonmagnetic bit line, the spins injected from the ferromagnetic word line.

With the accumulation of up-spins, the direction of magnetization for the second ferromagnetic layer becomes in parallel to the direction of magnetization for the ferromagnetic word line. In contrast, with the accumulation of down-spins, the direction of magnetization for the second ferromagnetic layer becomes in anti-parallel to the direction of magnetization of the ferromagnetic word line.

At the time of reading, current is made to flow between the nonmagnetic bit line and the wiring and also through the magnetoresistive element in the film-thickness direction thereof.

According to the present invention, the different current paths that are respectively used at the time of writing and at the time of reading reduce the risk of erroneous writing that would occur at the time of reading. In addition, at the time of writing, the large write-current is not allowed to flow directly through the magnetoresistive element, and only at the time of reading, the read-current is allowed to flow directly through the magnetoresistive element. Accordingly, the magnitude of the current applied to the magnetoresistive element—the record holding portion—at the time of writing can be made smaller. As a consequence, only a smaller voltage is applied to the magnetoresistive element. A spin memory with excellent durability is obtained in this way.

BRIEF DESCRIPTION OF THE DRAWINGS

FIGS. 2A and FIG. 2B are sectional diagrams each of which illustrates a spin-accumulation magnetization-switching magnetic memory element according to the first embodiment of the present invention.

FIGS. 5A and 5B are sectional diagrams each of which illustrates a spin-accumulation magnetization-switching magnetic memory element according to a second embodiment of the present invention.

DESCRIPTION OF THE PREFERRED EMBODIMENTS

A spin-accumulation magnetization-switching memory element and a magnetic random access memory according to the present invention will be described below in detail with reference to the accompanying drawings.

Embodiment 1

Figure 1:
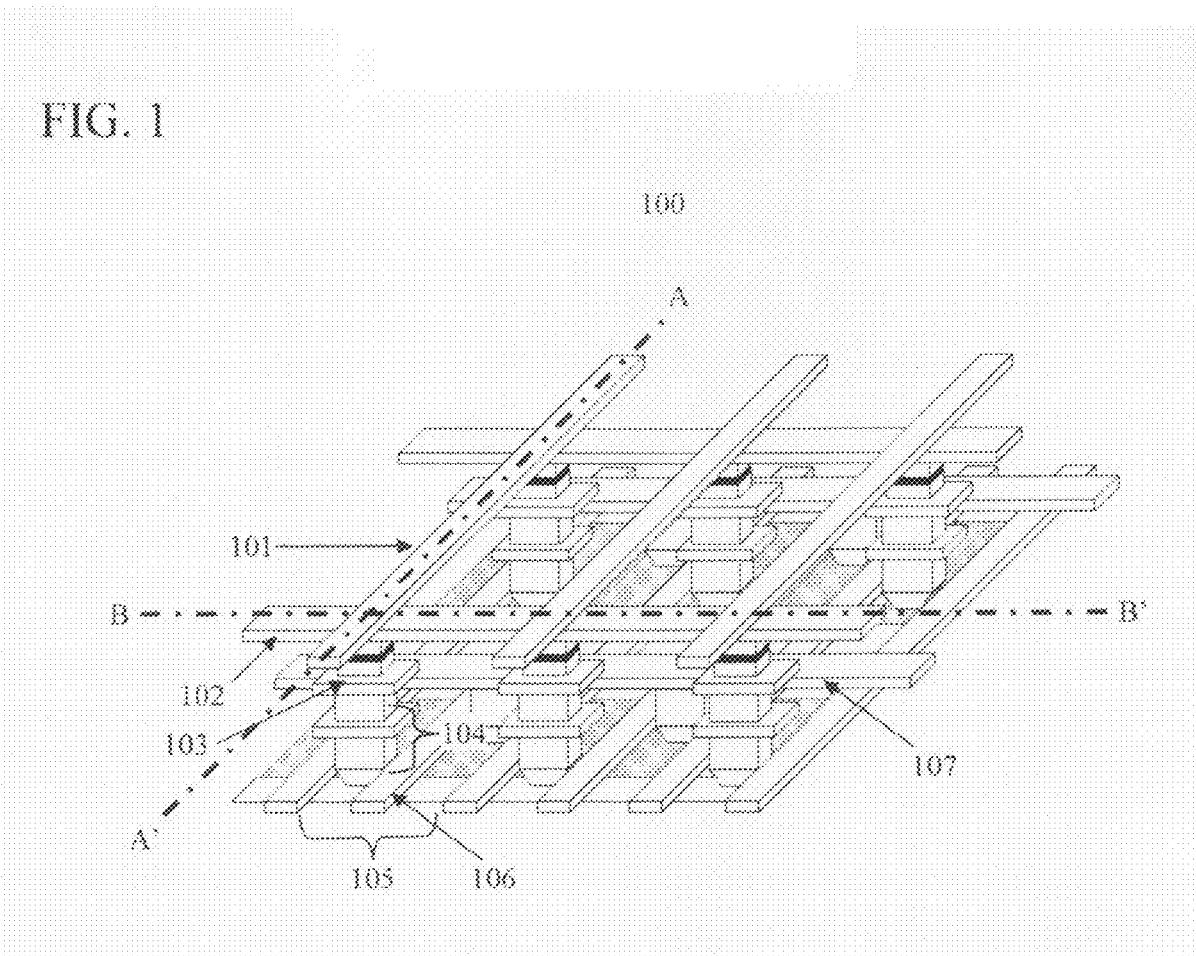
FIG. 1 is a schematic diagram illustrating a magnetic random access memory according to a first embodiment of the present invention.

FIG. 1 illustrates a magnetic random access memory (MRAM) according to an embodiment of the present invention. An MRAM 100 includes plural ferromagnetic write word lines 101 and plural nonmagnetic bit line 102. The lines 101 and 102 are arranged in a grid shape. A memory element 103 is disposed at each of the points where the ferromagnetic write word lines 101 cross the nonmagnetic bit lines 102. The memory element 103 is connected to the source electrode of a transistor 105 by means of a metal wiring layer 104.

Plural nonmagnetic read word lines 106 are arranged in parallel to the ferromagnetic write word lines 101, and are electrically connected to the gate electrodes of the transistors 105. Plural source lines 107 are arranged in parallel to the nonmagnetic bit lines 102, and are electrically connected to the drain electrodes of the transistors 105. The source lines 107 are made of a nonmagnetic material, for example.

As shown in FIG. 2, each of the memory elements 103 is a magnetoresistive element 201 that is formed between the ferromagnetic write word line 101 and the metal wiring layer 104 at each of the positions where the ferromagnetic write word lines 101 cross the nonmagnetic bit lines 102.

The magnetoresistive element 201 includes a first ferromagnetic layer (pinned layer) 202, a first nonmagnetic layer 203, and a second ferromagnetic layer (free layer) 204, while these layers 202 to 204 are formed in this order from the side of the metal wiring layer 104. Here, whether a direction of magnetization of the first ferromagnetic layer 202 (a direction of magnetization 207) is aligned in parallel or in anti-parallel to the direction of magnetization for the second ferromagnetic layer 204 (a direction of magnetization 206) determines the magnitude of resistance for the magnetoresistive element 201.

Accordingly, the direction of the magnetization for the first ferromagnetic layer 202 is preferably fixed, by means of anti-ferromagnetic coupling or the like, in the direction in which the ferromagnetic word line 101 extend. Here, the second ferromagnetic layer 204 is electrically connected to the nonmagnetic bit line 102 while the nonmagnetic bit line 102 electrically connected to the ferromagnetic write word line 101.

Incidentally, according to the present invention, the writing, in the direction of magnetization, in the free layer of the magnetoresistive element is achieved by the spin accumulation technique. The technique is implemented as follows. Firstly, a nonmagnetic layer is connected to a ferromagnetic layer. Then, spin polarized electrons are injected from the ferromagnetic layer into the nonmagnetic layer.

For example, as described in F. J. Jedema, H. B. Heersche, A. T. Filip, J. J. A. Baselmans and B. J. van Wees, "Electrical detection of spin precession a metallic mesoscopic spin valve", Nature 416, 713 (2002), the spin-polarized electrons injected in the nonmagnetic layer causes a non-equilibrium state for the spin in the nonmagnetic layer along the range of the spin-diffusion length of the nonmagnetic layer. In addition, another ferromagnetic layer is connected to the other side of the nonmagnetic material. Thus, a structure with two ferromagnetic layers sandwiching a nonmagnetic layer is formed.

In this case, as described in T. Kimura, Y. Otani and J. Hamrle, "Switching Magnetization of a Nanoscale Ferromagnetic Particle Using Nonlocal Spin Injection", Phys. Rev. Lett. 96, 037201 (2006), when spins are accumulated in the nonmagnetic layer by injecting spin-polarized electrons from one of the ferromagnetic layers into the nonmagnetic layer, the other one of the ferromagnetic layers can absorb the spins. In addition, when the density of states for the ferromagnetic layer of the spin-injection side and the density of states for the nonmagnetic layer are taken into consideration, the direction of the spins accumulated in the nonmagnetic layer can be changed by means of the direction of the current.

Accordingly, the ferromagnetic layer of the spin-absorption side changes its direction of magnetization in accordance with the direction of magnetization for the norunagnetic layer. To put it differently, rewriting of the direction of magnetization can be done by means of the direction of current.

Suppose that the spin-accumulation method such as one described above is employed as a method of rewriting the direction of magnetization for the free layer of the magnetoresistive element. In the magnetoresistive element 201 of Embodiment 1, first ferromagnetic layer 202 (pinned layer) and the second ferromagnetic layer 204 (free layer) are electrically connected to each other with the insulator 203 (intermediate layer) being placed in between. The magnetoresistive element 201 has a structure in which the magnetoresistive effect is exhibited by means of the direction of magnetization for the second ferromagnetic layer 204.

The second ferromagnetic layer 204 is electrically connected to the nonmagnetic bit line 102. In addition, the ferromagnetic write word line 101 is connected to the second ferromagnetic layer 204 so as to cross the nonmagnetic bit line 102.

Here the direction in which the ferromagnetic write word line 101 extends is aligned with the direction of the axis of easy magnetization for the first ferromagnetic layer 202 and for the second ferromagnetic layer 204. The first ferromagnetic layer 202 is electrically connected to the source line 107 by means of the metal wiring layer 104 and the transistor 105. The gate electrode of the transistor 105 is electrically connected to the nonmagnetic read word line 106.

In Embodiment 1, a transistor is used as one of the switching elements, but this is not the only configuration of the present invention.

Writing is performed by rewriting the direction of magnetization 206 for the second ferromagnetic layer 204, which is caused by making a write-current 205 flow between the ferromagnetic write word line 101 and the nonmagnetic bit line 102. The rewritten direction of magnetization 206 is aligned so as to correspond to the direction of the write-current 205. The direction of current flowing through the nonmagnetic bit line 102 may be directed either to the right-hand side in FIG. 2A or to the left-hand side in the same figure.

More detailed descriptions will be given below. In the magnetic random access memory, when one of the ferromagnetic write word lines 101 and one of the nonmagnetic bit lines 102 are selected, spins are injected from the ferromagnetic write word line 101 into the nonmagnetic bit line 102 near the memory element 103 located at the crossing point between the selected one of the ferromagnetic write word lines 101 and the selected one of the nonmagnetic bit lines 102. The spins thus injected are accumulated in the nonmagnetic bit line 102.

The write word line 101 is made from a ferromagnetic material. So injection of electrons from the write word line 101 to the nonmagnetic bit line 102 causes accumulation of spins of the same direction as the direction of the spins for the ferromagnetic write word line 101.

The spins accumulated in the nonmagnetic bit line 102 are diffused in the bit line 102, and is absorbed by the second ferromagnetic layer 204. Accordingly, the spins interact to the magnetization 206 and direction of magnetization 206 for the second ferromagnetic layer 204 becomes the same direction as the direction of magnetization 208 for the ferromagnetic write word line 101 when the write-current exceeds a predetermined threshold.

On the other hand, the injection of electrons from the nonmagnetic bit line 102 into the ferromagnetic write word line 101 causes electrons having spins with the same direction as the spins of the ferromagnetic write word line 101 to be more likely to pass through the write word line 101. Accordingly, spins with the opposite direction to the direction of the spins for the write word line 101 are accumulated in the nonmagnetic bit line 102.

The spins are diffused in the nonmagnetic bit line 102, and are absorbed by the second ferromagnetic layer 204. Accordingly, the direction of magnetization 206 for the second ferromagnetic layer 204 becomes the opposite direction to the direction of magnetization 208 for the ferromagnetic write word line 101 when the write-current exceeds a predetermined threshold.

In summary, the direction of magnetization 206 for the second ferromagnetic layer 204 can be rewritten by means of the direction of current. The writing operation will be described below in detail with reference to FIG. 3.

Figure 3A:
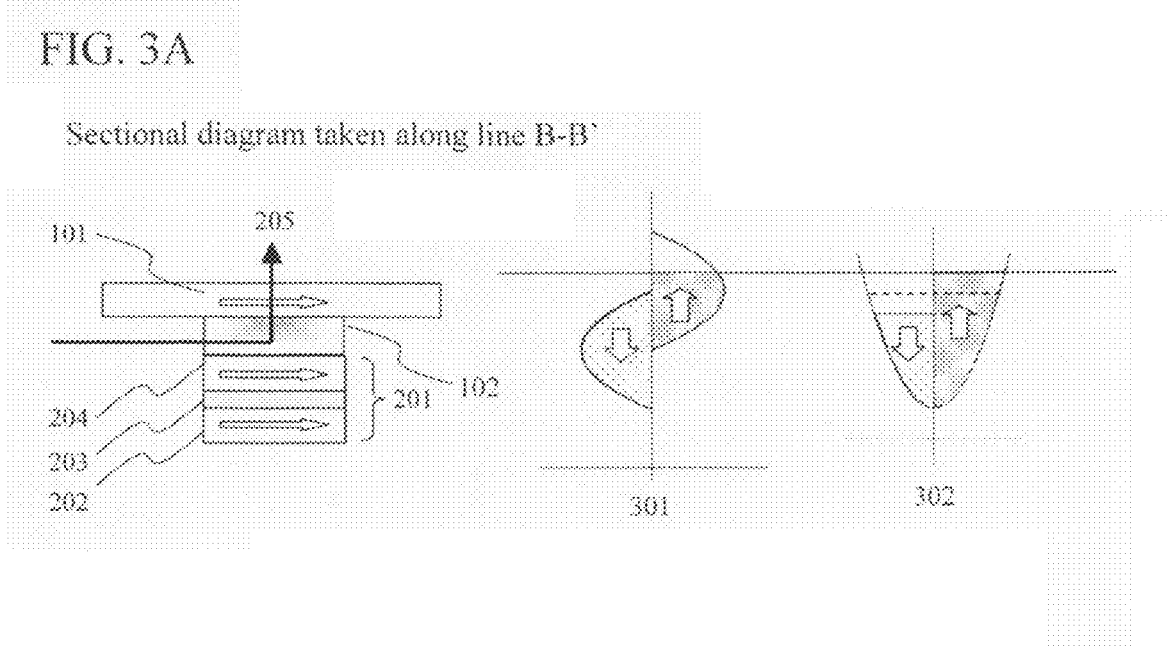
FIG. 3A is a schematic diagram illustrating an operational principle of the spin-accumulation magnetization-switching magnetic memory element shown in FIG. 2A

To begin with, descriptions will be given of the mechanism by which the direction of magnetization for the ferromagnetic write word line 101 and the direction of magnetization 206 for the second ferromagnetic layer 204 are made to be in parallel to each other. In this case, as FIG. 3A shows, the current flows from the nonmagnetic bit line 102 to the ferromagnetic write word line 101. This means that the electrons are conducted from the ferromagnetic write word line 101 to the nonmagnetic bit line 102. Accordingly, up-spins are accumulated in the nonmagnetic bit line 102 due to the difference in a density of states 301 for the ferromagnetic write word line 101. As a consequence, the direction of magnetization 206 for the second ferromagnetic layer 204 becomes in parallel to the direction of magnetization for the ferromagnetic write word line 101.

Figure 3B:
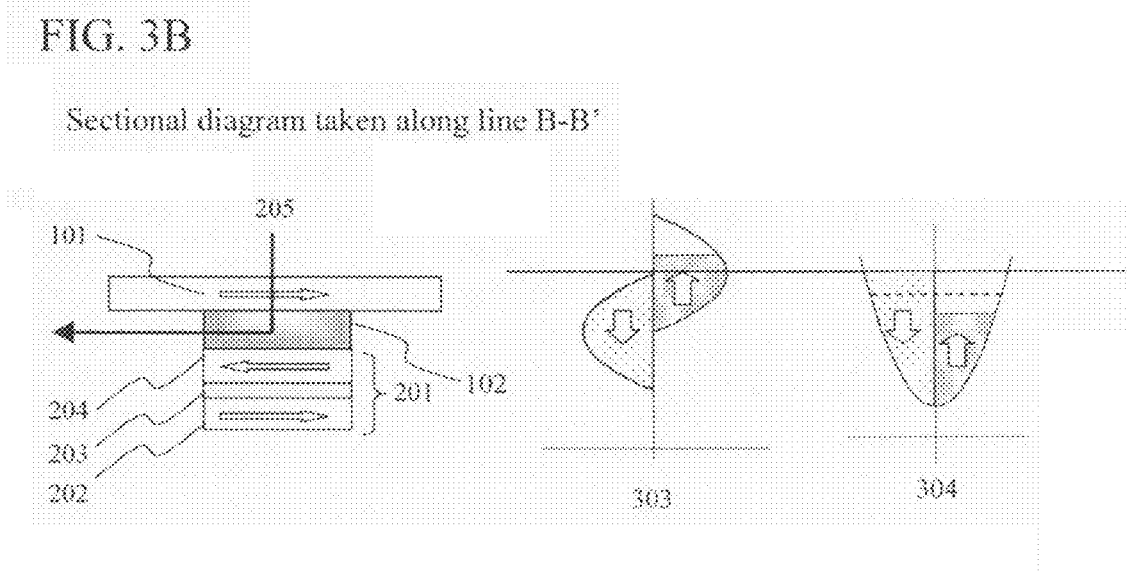
FIG. 3B is a similar diagram for the element shown in FIG. 2B.

Subsequently, descriptions will be given of the mechanism by which the direction of magnetization for the ferromagnetic write word line 101 and the direction of magnetization 206 for the second ferromagnetic layer 204 are made to be in anti-parallel to each other. In this case, as FIG. 3B shows, the current flows from the ferromagnetic write word line 101 to the nonmagnetic bit line 102. This means that the electrons are conducted from the nonmagnetic bit line 102 to the ferromagnetic write word line 101. Accordingly, up-spins are more likely to be conducted to the ferromagnetic write word line 101 due to the difference in a density of states 303 for the ferromagnetic write word line 101. This results in the accumulation of down-spins in the nonmagnetic bit line 102. The spins thus accumulated are absorbed by the second ferromagnetic layer 204, and thus the direction of magnetization 206 for the second ferromagnetic layer 204 is switched. As a consequence, the direction of magnetization 206 for the second ferromagnetic layer 204 and the direction of magnetization for the ferromagnetic write word line 101 come to be in anti-parallel to each other.

Subsequently, the reading operation will be described below. The magnitude of resistance for the part of the magnetoresistive element 201 in FIG. 2 determines the data to be read. Accordingly, it is necessary to make the current flow through the magnetoresistive element 201. The current path in this case is shown in FIG. 2A by a read-current 209. Note that the direction of the current flowing through the nonmagnetic bit line 102 and a source line 107 may be directed either to the right-hand side or to the left-hand side in FIG. 2A.

Application of voltage to the nonmagnetic read word line 106 activates the transistor 105. Accordingly, the read-current 209 is allowed to flow from the nonmagnetic bit line 102, through the magnetoresistive element 201, the metal wiring layer 104, and the transistor 105, to the source line 107. The resistance for the magnetoresistive element 201 can be read consequently.

The layered structure allows the electrons injected from ferromagnetic write word line 101 at the time of writing to be diffused in the nonmagnetic bit line 102 in the film-thickness direction. The electrons thus diffused are then absorbed by the second ferromagnetic layer 204. The bit line can be formed as thin as several nanometers, approximately. As a result, the current needed for the rewriting can be decreased from the case where element is formed in the in-plane direction.

Here, the magnitude of the spin-accumulation effect in the bit line is proportional to the value of Formula (1) given below. In the Formula (1), P represents the spin polarization for the electron spins injected from the ferromagnetic write word line 101 to the nonmagnetic bit line 102, S represents the spin-diffusion length of the bit line, I represents the electric current, G represents the conductance of the bit line, A represents the sectional area of the TMR element, and L represents the film thickness of the bit line.

$$P^2 S I \cdot \exp(-L/S)/GA \quad (1)$$

The formula indicates the accumulation effect becomes larger so as to be inversely proportional to A. To put it differently, as the TMR element becomes finer, the accumulation effect becomes larger, and the current needed for the writing becomes smaller. Likewise, as the film thickness L of the bit line becomes smaller, the accumulation effect becomes larger.

Figure 4:
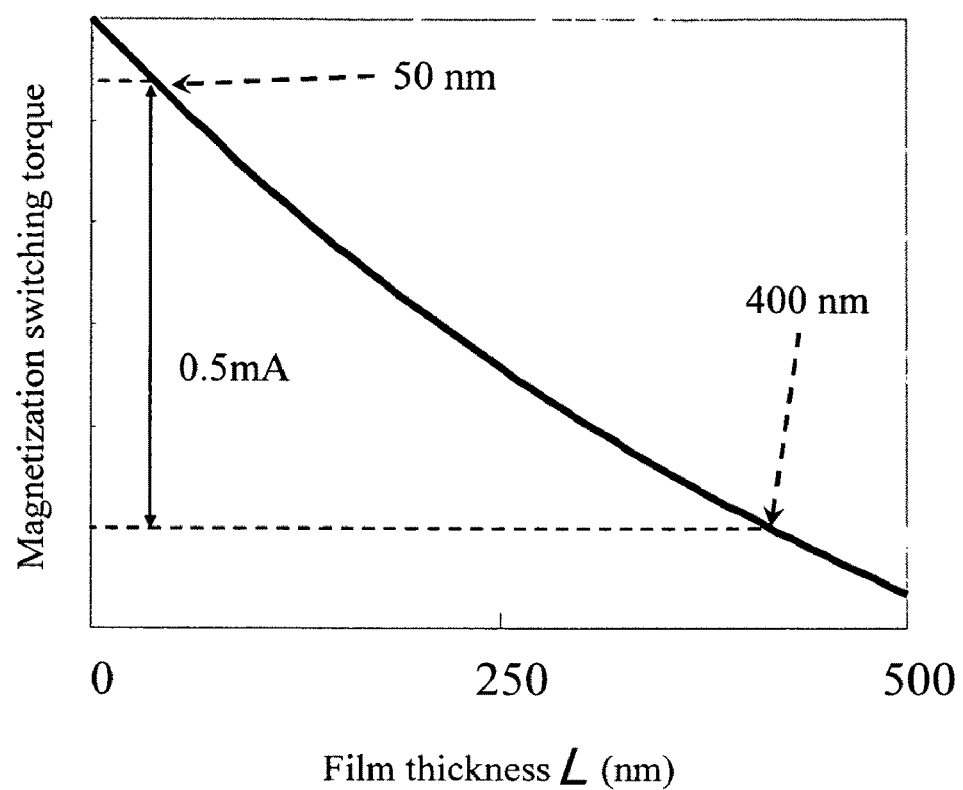
FIG. 4 is a chart illustrating that the spin accumulation effect of the present invention depends on the film thickness of a nonmagnetic bit line.

FIG. 4 shows the results of estimation for the magnitude of the spin accumulation while L is being gradually decreased. When the sectional area of the TMR element is 50×180 nm, a decrease of the film thickness from 400 nm to 50 nm causes a decrease of the write-current down to 0.5 mA. The film thickness still can be decreased. This means that the present invention is significantly useful to decrease the write-current.

Any ferromagnetic materials, such as Co, Fe, Ni, CoFe, CoFeB, NiFe, and NiFeB, can be cited as the candidate materials for the ferromagnetic write word line 101. In order to decrease further the write-current, the material to be chosen should have a high polarization ratio P, for example, a half-metal or the like. In the case of a half-metal, the ratio P is approximately equal to 1, so that the write current can be lowered.

Any nonmagnetic materials, such as Al and Cu, can be cited as the candidate materials for the nonmagnetic bit line 102. In order to decrease the write-current, it is preferable that the material to be chosen should achieve a large spin-diffusion length S for the bit line and a small conductance G. Accordingly, use of a semiconductor or a superconductor material is effective. The use of a semiconductor material achieves the lowering of the conductance G without lowering the spin-diffusion length S. In a case where a superconductor material is used, the electrons injected from the ferromagnetic write word line 101 are injected into the superconductor bit line that is in a quasi-particle state. As a consequence, the effective conductance G can be lowered.

The magnetoresistive element 201—the portion where the data is actually held—preferably has a larger change in the resistance. Accordingly, the magnetoresistive element 201 may have a CPP-GMR structure, but what is more preferable is the use of a tunnel magnetoresistive element (TMR element), which exhibits a larger change in resistance.

Any nonmagnetic materials can be used for the magnetoresistive element 201 having a PP-GMR structure. In the case of the magnetoresistive element 201 using the TMR element, an insulator is used as the first nonmagnetic layer 203. Some examples of the materials for the insulator are aluminum oxide and magnesium oxide. Above all, magnesium oxide is preferable because of the larger change in resistance achieved by the use of magnesium oxide. Any ferromagnetic materials, such as Co, Fe, Ni, CoFe, CoFeB, NiFe, and NiFeB are cited as the candidate materials for the first ferromagnetic layer 202 and for the second ferromagnetic layer 204. In order to increase further the change in resistance, use of, for example, a half-metal having a large polarization ratio P is preferable.

As described above, in the magnetic random access memory according to the present invention, use of the configuration that has been described thus far makes it possible to separate the current path for the read-current of the memory element 103 from the current path for the write-current of the memory element 103. In this case, the current path for the writing and the current path for the reading are different from each other, so that no current flows through the magnetoresistive element 201, which is to serve as the actual recording portion at writing.

The write current is larger than the read current. The configuration in which the write-current is not flowed directly through the magnetoresistive element 201 can lower the possibility of breaking the magnetoresistive elements 201. In addition, the risk of erroneous writing becomes less likely to occur at the time of reading.

In particular, when the TMR element is used, the breakage of the TMR element occurs at approximately 1 V. In the present invention, however, the current flows through the TMR element at the time of the only reading process. The reading of the magnitude of resistance for the TMR element is possible if there is a 0.2-V difference in the voltage with the certain reading current. For this reason, the breakage of elements can be reduced. Note that the design for the read-current value may still affect the results.

Embodiment 2

As shown in FIG. 5, the nonmagnetic bit line 102 and the ferromagnetic write word line 101 may be electrically connected to each other by means of a second insulator 501. Here, the second insulator 501 has a function of a tunnel barrier.

With this configuration, the spins injected from the write word line 101 do not suffer from the scattering at the interface of the write word line 101 and the bit line 102, and the spin polarization P exhibits a high value that is equivalent to a case of a write word line of a ferromagnetic material. This results in a reduction in the write-current.

Embodiment 3

Figure 6A:
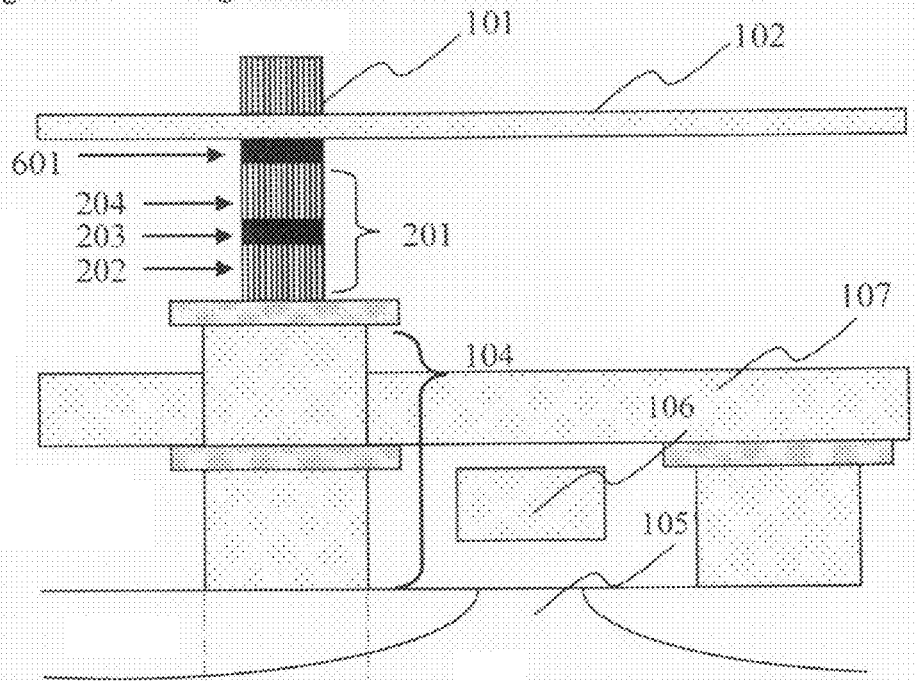
FIGS. 6A and 6B are sectional diagrams each of which illustrates a spin-accumulation magnetization-switching magnetic memory element according to a third embodiment of the present invention.
Figure 6B:
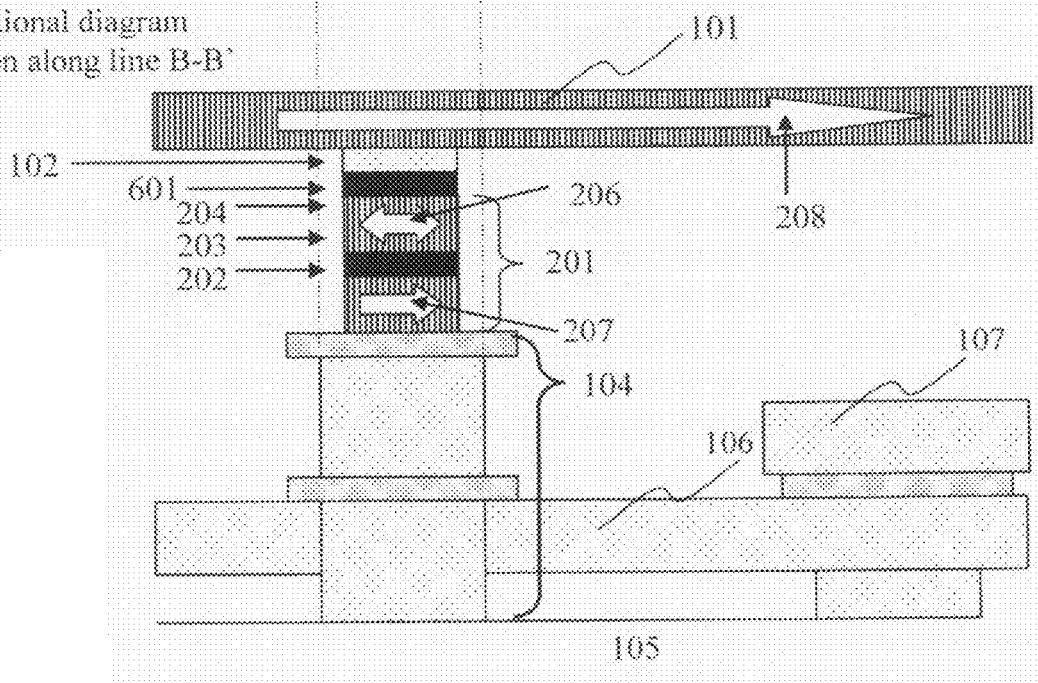

As shown in FIG. 6, the second ferromagnetic layer 204 and the nonmagnetic bit line 102 may be electrically connected to each other by means of a third insulator 601. Here, the third insulator 601 has a function of a tunnel barrier. When no such third insulator 601 is used, the second ferromagnetic layer 204 acts as a sink for the spin-polarized electrons. The use of the third insulator prevents the electrons from being suffered from the scattering at the interface. As a consequence, the electrons are conducted to the second ferromagnetic layer 204 while a high polarization ratio is maintained.

Embodiment 4

Descriptions will be given of a case where a multi-valued structure is formed in a magnetic memory including a spin-accumulation magnetization-switching magnetic recording element.

Figure 7:
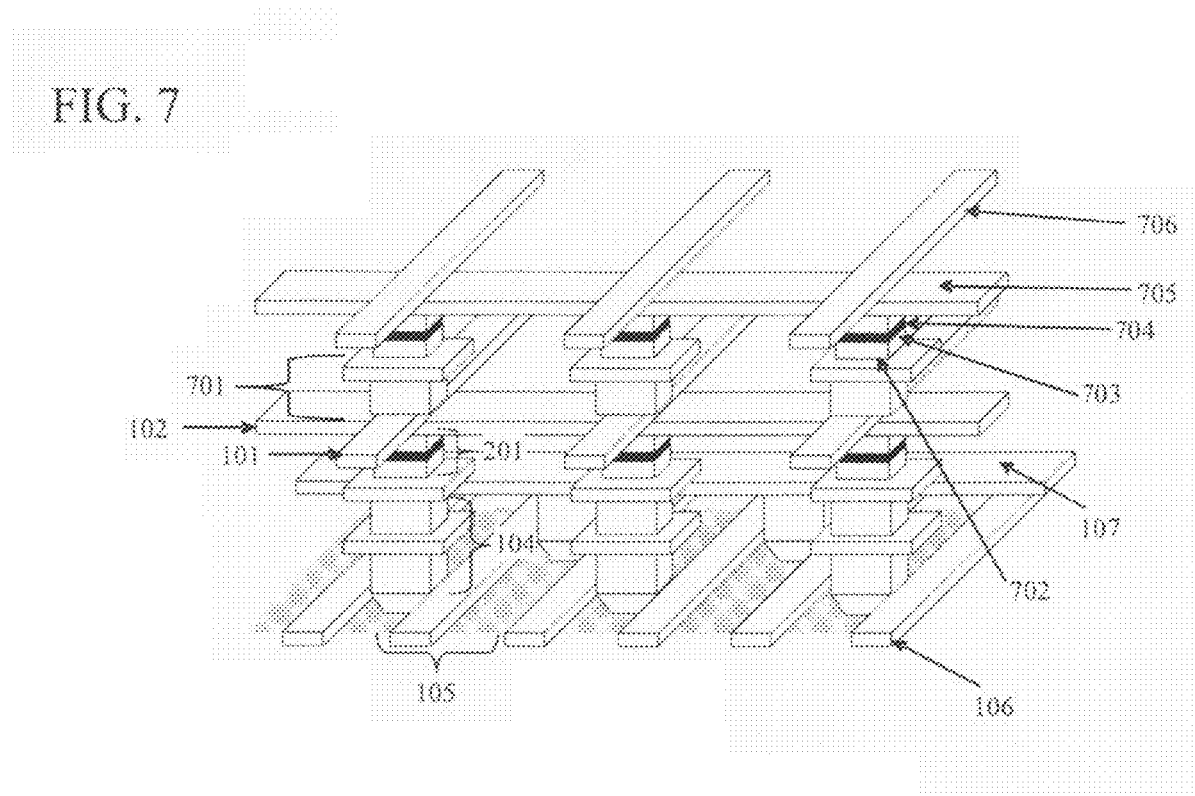
FIG. 7 is a schematic diagram illustrating a magnetic random access memory according to a fourth embodiment of the present invention.

As FIG. 7 shows, by stacking magnet recording elements on top of another, at the portion where the ferromagnetic write word line 101 and the nonmagnetic read bit line 102 cross each other, the magnetic memory can be made multi-valued. In this case, in the magnetic memory shown in FIG. 1, at the position where the ferromagnetic write word line 101 crosses the nonmagnetic read bit line 102, a third ferromagnetic layer 702, a second nonmagnetic layer 703, and a fourth ferromagnetic layer 704 are electrically connected to one another by means of a metal wiring layer 701. The fourth ferromagnetic layer 704 is electrically connected to a second ferromagnetic write word line 706 by means of a second nonmagnetic bit line 705.

DESCRIPTION OF REFERENCE NUMERALS

100: magnetic random access memory
101: ferromagnetic write word line

102: plural nonmagnetic bit-lines
103: memory element
104: metal wiring layer
105: transistor
106: nonmagnetic read word line
107: source line
201: magnetoresistive element
202: first ferromagnetic layer
203: first nonmagnetic layer
204: second ferromagnetic layer
205: write-current between ferromagnetic write word line and nonmagnetic bit line
206: magnetization of second ferromagnetic layer
207: magnetization of first ferromagnetic layer
301: density of states for ferromagnetic write word line at parallel writing
302: density of states for read bit line at parallel writing
303: density of states for a ferromagnetic write word line at anti-parallel writing
304: density of states for a read bit line at anti-parallel writing
501: second insulator
601: third insulator
701: metal wiring layer
702: third ferromagnetic layer
703: second nonmagnetic layer
704: fourth ferromagnetic layer
705: second nonmagnetic bit line
706: second ferromagnetic write word line

What is claimed is:

1. A memory element comprising:
a word line consisted of ferromagnetic materials (ferromagnetic word line);
a bit line consisted of nonmagnetic materials (nonmagnetic bit line) that crosses the ferromagnetic word line;
a wiring disposed so as to be opposed to the ferromagnetic word line; and
a magnetoresistive element formed between the wiring and the portion where the ferromagnetic word line and the nonmagnetic bit line cross each other,
wherein the magnetoresistive element includes a first ferromagnetic layer formed on the side of the wiring, a second ferromagnetic layer formed on the side of the ferromagnetic word line, a nonmagnetic layer formed between the first ferromagnetic layer and the second ferromagnetic layer,
at the time of writing, the direction of magnetization for the second ferromagnetic layer is switched by making current flow between the ferromagnetic word line and the nonmagnetic bit line so as to accumulate spins in the nonmagnetic bit line, the spins being injected from the side of the ferromagnetic word line, and
at the time of reading, the current is made to flow in the film-thickness direction of the magnetoresistive element.

2. The memory element according to claim 1 wherein
at the time of writing,
up-spins are accumulated from the ferromagnetic word line to the nonmagnetic bit line by making current flow from the nonmagnetic bit line towards the ferromagnetic word line, and
down-spins are accumulated from the ferromagnetic word line to the nonmagnetic bit line by making the current flow from the ferromagnetic word line towards the nonmagnetic bit line.

3. The memory element according to claim 2 wherein
with the accumulation of up-spins, the direction of magnetization for the second ferromagnetic layer becomes in parallel to the direction of magnetization for the ferromagnetic word line, and
with the accumulation of down-spins, the direction of magnetization for the second ferromagnetic layer becomes in anti-parallel to the direction of magnetization for the ferromagnetic word line.

4. The memory element according to claim 1 wherein the current is made to flow between the nonmagnetic bit line and the wiring at the time of reading.

5. The memory element according to claim 4 wherein the magnetoresistive element is electrically connected to a source line by means of a switching element.

6. The memory element according to claim 5 further comprising:
a read word line; and
a source line, wherein
the switching element is a transistor,
the read word line is electrically connected to a gate electrode of the transistor,
the source line is electrically connected to a drain electrode of the transistor, and
the wiring is electrically connected to a source electrode of the transistor.

7. The memory element according to claim 1, further comprising an insulator formed between the nonmagnetic bit line and the ferromagnetic word line.

8. The memory element according to claim 1 further comprising an insulator formed between the second ferromagnetic layer and the nonmagnetic bit line.

9. The memory element according to claim 1 wherein the magnetoresistive element is any one of a CPP-GMR element and a TMR element.

10. A spin RAM comprising:
a first ferromagnetic word line;
a first nonmagnetic bit line that crosses the first ferromagnetic word line;
a first wiring that is disposed so as to be opposed to the first ferromagnetic word line;
a first magnetoresistive element formed between the first wiring and the portion where the first ferromagnetic word line and the first nonmagnetic bit line cross each other;
a second wiring formed on the opposite side of the surface of the first ferromagnetic word line to the side where the first ferromagnetic word line crosses the first nonmagnetic bit line;
a second ferromagnetic word line;
a second nonmagnetic bit line that crosses the second ferromagnetic word line; and
a second magnetoresistive element formed between the second wiring and the portion where the second ferromagnetic word line and the second nonmagnetic bit line cross each other, wherein
the first magnetoresistive element includes: a first ferromagnetic layer formed on the first-wiring side of the magnetoresistive element; a second ferromagnetic layer formed on the first-ferromagnetic word line side; and a first nonmagnetic layer formed between the first ferromagnetic layer and the second ferromagnetic layer,
the second magnetoresistive element includes: a third ferromagnetic layer formed on the second-wiring side; a fourth ferromagnetic layer formed on the second-ferromagnetic-word-line side; and a second nonmagnetic layer formed between the third ferromagnetic layer and the fourth ferromagnetic layer, at the time of writing, the direction of magnetization for the second ferromagnetic layer is switched by making current flow between the first ferromagnetic word line and the first nonmagnetic bit line so as to accumulate spins in the first nonmagnetic bit line, the spins being injected from the side of the first ferromagnetic word line, while the direction of magnetization for the fourth ferromagnetic layer is switched by making current flow between the second ferromagnetic word line and the second nonmagnetic bit line so as to accumulate spins in the second nonmagnetic bit line, the spins being injected from the second ferromagnetic word line, and at the time of reading, current is made to flow in the film-thickness direction of the first magnetoresistive element and of the second magnetoresistive element.

11. The spin RAM according to claim 10 wherein the first magnetoresistive element and the second magnetoresistive element are electrically connected to a source line by means of a switching element.

12. The spin RAM according to claim 11 further comprising a read word line wherein the switching element is a transistor, the read word line is electrically connected to a gate electrode of the transistor, the source line is electrically connected to a drain electrode of the transistor, and the first wiring is electrically connected to a source electrode of the transistor.

* * * * *